US006402598B1

(12) United States Patent
Ahn et al.

(10) Patent No.: US 6,402,598 B1
(45) Date of Patent: Jun. 11, 2002

(54) CHEMICAL MECHANICAL POLISHING APPARATUS AND METHOD OF WASHING CONTAMINANTS OFF OF THE POLISHING HEAD THEREOF

(75) Inventors: Yo-han Ahn; Byung moo Lee; Jae-won Choi; Tae-ho Kim, all of Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 14 days.

(21) Appl. No.: 09/593,931

(22) Filed: Jun. 15, 2000

(30) Foreign Application Priority Data

Jun. 16, 1999 (KR) ............................................. 99-22542

(51) Int. Cl.⁷ ................................................. B24B 7/22
(52) U.S. Cl. ............................. 451/65; 451/288; 451/41
(58) Field of Search ........................... 451/67, 65, 288, 451/287, 41, 5, 398, 388

(56) References Cited

U.S. PATENT DOCUMENTS

| | | | |
|---|---|---|---|
| 5,655,954 A | * | 8/1997 | Oishi et al. .................... 451/67 |
| 5,738,574 A | * | 4/1998 | Tolles et al. ................. 451/288 |
| 6,050,884 A | * | 4/2000 | Togawa et al. ................ 451/67 |

FOREIGN PATENT DOCUMENTS

JP          62-224563      * 10/1987   ................. 451/288

* cited by examiner

Primary Examiner—Robert A. Rose
(74) Attorney, Agent, or Firm—Volentine Francos, PLLC

(57) ABSTRACT

A chemical mechanical polishing (CMP) apparatus for planarizing the surface of a semiconductor wafer is provided with a washing unit including first, second and third nozzles installed within a load-cup where the loading and unloading of the wafers takes place. The first nozzles spray deionized water toward the top face of a pedestal on which the wafers are placed in the load cup, thereby washing contaminants off of the pedestal. The second nozzles spray deionized water toward a membrane provided at the bottom of a polishing head, thereby washing the membrane. The third nozzles spray deionized water through purge holes formed in a retainer ring of the polishing head toward a space formed between the outer surface of the membrane and the inner surface of the retainer ring. Consequently, contaminants induced into the space are washed away. The CMP apparatus also includes an exhaust unit having an outlet, an exhaust pump and an exhaust pipe connecting the outlet and the exhaust pump, for exhausting contaminants to the outside of the CMP apparatus through a protective cover thereof. The exhaust outlet is provided at the bottom of a side of the protective cover.

12 Claims, 11 Drawing Sheets

CHEMICAL MECHANICAL POLISHING APPARATUS AND METHOD OF WASHING CONTAMINANTS OFF OF THE POLISHING HEAD THEREOF

BACKGROUND OF THE INVENTION

1. Field of the Invention

The present invention relates to a chemical mechanical polishing apparatus used in manufacturing a semiconductor device. More particularly, the present invention relates to the polishing head of a chemical mechanical polishing apparatus, and to a method of washing contaminants off of the polishing head.

2. Description of the Related Art

Increasing the integration of semiconductor devices has required sequentially depositing multiple layers on a wafer. Accordingly, the semiconductor manufacturing process must include steps for planarizing each layer formed on the semiconductor wafer. Chemical mechanical polishing (CMP) is a typical process used for this purpose. In fact, CMP is well-suited for use in connection with large-diameter wafers because CMP produces excellent uniformity in planarizing wide areas in addition to narrow ones.

The CMP process makes use of mechanical friction and a chemical agent for finely polishing a wafer surface, such as that comprising tungsten or an oxide. In the mechanical aspect of such polishing, a wafer is placed on a rotating polishing pad and is rotated while a predetermined is load applied thereto, whereby the wafer surface is polished by the friction created between the polishing pad and the wafer surface. In the chemical aspect of such polishing, the wafer surface is polished by a chemical polishing agent, referred to as slurry, supplied between the polishing pad and the wafer.

A conventional CMP system will now be described with reference to FIGS. 1–7.

As shown in FIG. 1, the conventional CMP system includes a CMP apparatus 100 and a wafer transfer apparatus 170 adjacent to the CMP apparatus 100.

The CMP apparatus 100 includes a base 110, several polishing pads 120 installed on the base 110, a load-cup 130 for loading/unloading wafers 10, and a head rotation unit 140 having a plurality of polishing heads for holding the wafers 10 tight and rotating the same on the polishing pads 120. A protective cover 150 is installed on the upper portion of the base 110. The protective cover 150 surrounds and thereby protects the polishing pads 120, the load-cup 130 and the head rotation unit 140 . The protective cover 150 is also made of a transparent material which allows the polishing pad 120s, the load-cup 130 and the head rotation unit 140 to be viewed from outside the cover. An outlet 151 through which dust or other contaminants present inside the protective cover 150 are exhausted is provided on the protective cover 150 and is connected to an exhaust pump (not shown) through an exhaust pipe 152.

The wafer transfer apparatus 170 loads the wafers 10 into the CMP apparatus 100 and transfers the polished wafers 10 from one processing station to the next. The wafer transfer apparatus 170 includes a case 171 in which the wafers 10 are situated, a holder 174 for grabbing the wafers 10 from the case 171 and loading the same on the load-cup 130 of the CMP apparatus 100, an elevating arm for elevating the holder 174 and rotating the same, and a track 172 for supporting the elevating arm 173 and reciprocating the same in a predetermined direction.

The protective cover 150 also forms a wafer entrance 153 in one side thereof. The wafers 10 are loaded onto and are unloaded from the load-cup 130 by the wafer transfer apparatus 170 via the wafer entrance 153 in the cover 150.

Referring now to FIG. 2, a plurality of polishing pads, generally three polishing pads 120a, 120b and 120c, are installed on the base 110 so that a plurality of wafers can be processed at a time. The polishing pads 120a, 120b and 120c are fixed to a rotatable carousel (not shown). Pad conditioners 121a, 121b and 121c for adjusting the surface states of the polishing pads 120a, 120b and 120c, and slurry supplying arms 122a, 122b and 122c for supplying slurry to the surfaces of the polishing pads 120a, 120b and 120c, are disposed adjacent the polishing pads 120a, 120b and 120c.

The head rotation unit 140 includes four polishing heads 141a, 141 b, 141c and 141d and four rotation shafts 142a, 142b, 142c and 142d. The polishing heads 141a, 141b, 141c and 141d hold wafers against the polishing pads so that a predetermined pressure is exerted thereon while the wafers are being polished. The rotation shafts 142a, 142b, 142c and 142d for rotating the polishing heads 141a, 141b, 141c and 141d, respectively, are mounted on a frame 143 of the head rotation unit 140. A driving mechanism for rotating the rotation shafts 142a, 142b, 142c and 142d is provided within the frame 143 of the head rotation unit 140. The head rotation unit 140 is supported by a rotary bearing 144 so as to be rotatable about the longitudinal axis of the bearing 144.

Furthermore, the load-cup 130 includes a circular pedestal 131 which supports the wafers. As will be described later, the polishing heads 141a, 141b, 141c and 141d are washed at and by the load-cup 130.

The operation of the CMP apparatus having the structure described above will now be described with reference to FIGS. 2 and 3. First, the wafer 10 transferred to the load-cup 130 by the wafer transfer apparatus 170 is placed on the surface of the pedestal 131 of the load-cup 130. There, the wafer 10 is vacuum-chucked on the surface of the pedestal 131 so as to be fixed in place. Then, the wafer 10 is lifted using the pedestal 131 and is thereby transferred to a polishing head 141 positioned above the pedestal 131. The wafer is then vacuum-chucked to the polishing head 141, and the head rotation unit 140 is rotated to transfer the wafer to a position above the polishing pad 120a adjacent to the load-cup 130 . Then, the polishing head 141 is lowered so that the wafer 10 is pressed tightly against the polishing pad 120a. The wafer is polished in this state while slurry is supplied between the wafer and the polishing pad 120a. In this case, the polishing pad 120a and the wafer 10 rotate in the same direction, typically counter-clockwise. Each wafer 10 is transferred sequentially among the three polishing pads 120a, 120b and 120c and then to the load-cup 130 where the wafer is placed on the pedestal 131. Thereafter, the wafer transfer apparatus 170 transfers the wafer 10 placed on the pedestal 131 to the outside of the CMP apparatus 100.

Once the wafer 10 has been unloaded, the polishing head 141 is lowered towards the load-cup 130. In such a state, deionized water is sprayed to wash the bottom of the polishing head 141 and the pedestal 131. When the washing is completed, the polishing head 141 and the pedestal 131 are raised and a new wafer is transferred by the wafer transfer apparatus 170 to the pedestal 131.

Next, as shown in FIGS. 4 and 5, a first nozzle 135 and a second nozzle 136 for spraying deionized water are provided in a washing basin 132 of the load-cup 130. The first nozzle 135 is oriented so as to spray deionized water toward the top surface of the pedestal 131, and the second nozzle 136 is oriented so as to spray deionized water toward a membrane 1411 installed at the bottom of the polishing head 141. The membrane 1411 allows a vacuum to be exerted on the wafer held by the polishing head. Three sets of the first and second nozzles 135 and 136 are spaced from each other at equal angular intervals about the pedestal 131. Three wafer aligners 133 for guiding a wafer into position are installed within the washing basin 132 of the load-cup 130. The wafer aligners 133 are also spaced form one another at equal angular intervals abut the circumference of the pedestal 131.

The washing basin 132 is supported by a cylindrical support housing 134. A flexible hose 1352 for supplying deionized water to the first and second nozzles 135 and 136 is installed within the support housing 134. A washing fluid channel 1351 connects the flexible hose 1352 to the first and second nozzles 135 and 136 within the washing basin 132.

A plurality of spray orifices 1311 in the pedestal 131 spray deionized water upwards to wash the membrane 1411. A lateral passageway 1312 in the pedestal 131 connects the spray orifices 1311. The lateral passageway 1312 is connected to a vertical passageway 1313 formed inside a tubular pedestal column 138 which supports the pedestal 131.

As described above, the load-cup 130 is responsible for washing the membrane 1411 on the bottom of the polishing head 141, for washing the pedestal 131, and for supporting wafers during the loading and unloading thereof onto and from the CMP apparatus 100. The washing step is very important in the CMP process. Contaminants such as slurry debris or polished silicon particles are unavoidably produced during the CMP process, and some of the contaminants may remain on the surface of the membrane 1411 and/or the pedestal 131. The contaminants remaining on the surface of the membrane 1411 and/or the pedestal 131 can generate micro-scratches on the wafer surface if the contaminants are transferred thereto when the wafer is loaded in the course of polishing. The micro-scratches may cause defects such as gate oxide leakage or gate line bridging in the semiconductor devices, which lowers the yield and reliability of the semiconductor devices. Thus, any contaminants remaining on the membrane 1411 and/or the pedestal 131 must be removed by washing the same using deionized water.

However, such contaminants cannot be completely removed by the washing operation performed by the conventional CMP apparatus. This washing operation will now be described with reference to FIGS. 6 and 7.

The polishing head 141 of the CMP apparatus holds a wafer thereto under a predetermined amount of pressure and rotates the wafer in such a state. More specifically, the wafer is held by a vacuum to the polishing head 141 while it is rotated. To this end, a vacuum line 1419 is provided within the polishing head 141, and a membrane support plate 1414 having a plurality of holes 1415 communicating with the vacuum line 1419 is installed at the bottom of the polishing head 141. A membrane pad 1416 is closely fixed on the bottom of the membrane support plate 1414. A membrane pad 1416 is fixed close to the bottom of the membrane support plate 1414. The bottom of the membrane pad 1416 and the outer surface of the membrane support plate 1414 are surrounded by the membrane 1411, which is made of a flexible material which comes into direct contact with wafers. The membrane 1411 is fixed to the membrane support plate 1414 by a membrane clamp 1417. A retainer ring 1412 for preventing wafers from deviating outwards during polishing is disposed at the lower outer edge of the polishing head 141, that is, at the perimeter of the membrane 1411. Four purge holes 1413 are provided at the outer circumference of the retainer ring 1412 at equal angular intervals. While a wafer is adhered to the membrane 1411, air can enter/leave a small space 1418, formed between the membrane support plate 1414 and the retainer ring 1412, via the purge holes 1413.

In the polishing head 141 having the structure described above, a narrow gap having a width (D) of about 0.254 mm is present between the membrane 1411 and the retainer ring 1412 so that the membrane 1411 can be elevated with respect to the retainer ring 1412 when a load is applied to a wafer. However, the slurry or contaminants produced during polishing are induced into the space 418 through the gap having the width D. The slurry or contaminants induced into the space 1418 can not be and are not removed by the washing means of the load cup 130. Also, as shown in FIG. 7, although four purge holes 1413 are provided in the retainer ring 1412, the diameters thereof are at most 2 mm. Thus, the contaminants induced into the space 1418 cannot be exhausted through the small purge holes 1413. Thus, the contaminants accumulate over time and solidify as moisture evaporates therefrom.

The solidified slurry or contaminants drop onto the surface of a polishing pad due to vertical movement of the membrane 1411 or slight vibration of the polishing pad during polishing. The size of the contaminants which drop onto the surface of the polishing pad exceed several micrometers, whereby micro-scratches or even macro-scratches can be formed in the surface of a wafer.

Nonetheless, the conventional CMP apparatus is provided with means for exhausting contaminants such as slurry debris or polished silicon particles while preventing the contaminants from being diffused into a clean room and in an attempt to prevent the wafers from being contaminated.

Referring again to FIG. 1, the exhaust means includes the outlet 151 provided on the protective cover 150, an exhaust pump (not shown) and the exhaust pipe 152 connecting the outlet 151 with the exhaust pump. The slurry debris or polished silicon particles typically present inside the CMP apparatus are larger and heavier than particles in the air and are generally produced on the polishing pad 120 at a location remote from the outlet 151. Accordingly, the contaminants present inside the CMP apparatus cannot be effectively exhausted through the conventional exhaust outlet 151 and therefore remain inside the apparatus. These residual contaminants may scratch the wafer surface.

As described above, contaminants such as polished silicon particles or slurry debris are not completely removed in the conventional CMP apparatus. Thus, the surfaces polished by the CMP apparatus can become scratched, thereby lowering the yield and reliability of semiconductor devices produced from the wafers polished by the CMP apparatus.

SUMMARY OF THE INVENTION

It is an object of the present invention to solve such problems of the prior art by providing a chemical mechanical polishing (CMP) apparatus for and a method of effectively removing contaminants which would otherwise scratch the wafer surface.

More specifically, it is a first object of the present invention to provide a CMP apparatus having washing means which can effectively remove contaminants such as slurry debris adhered to the inside of a polishing head of the apparatus.

It is another object of the present invention to provide a CMP apparatus having exhaust means which can effectively exhaust contaminants such as slurry debris adhered to the inside of the apparatus.

It is still another object of the present invention to provide a method of washing away contaminants such as slurry debris adhered to the inside of a polishing head of a CMP apparatus.

To achieve the first object, the present invention provides a chemical mechanical polishing (CMP) apparatus for planarizing the surface of a semiconductor wafer, the CMP apparatus including first, second and third spray nozzles. The first nozzles are disposed within a load-cup where the loading and unloading of the wafers takes place and spray deionized water toward the top surface of a pedestal on which the wafers are supported so as to wash the pedestal. The second nozzles are disposed within the load-cup and spray deionized water toward a membrane provided at the bottom of a polishing head of the apparatus so as to wash the membrane. The third nozzles are also disposed within the load-cup, and spray deionized water through purge holes in a retainer ring of the polishing head, toward a space formed between the outer surface of the membrane and the inner surface of the retainer ring, whereby contaminants induced into the space are washed away.

Preferably, at least three of the third nozzles are disposed along the inner surface of the load-cup at equal intervals. In one embodiment, an annular deionized water supply line extends along the inner surface of the load-cup and the third nozzles are installed in the deionized water supply line at predetermined intervals. The number of third nozzles is preferably the same as that of the purge holes formed in the retainer ring.

To achieve the second object, the CMP apparatus further includes exhaust means comprising an outlet, an exhaust pump and an exhaust pipe connecting the outlet and the exhaust pump, for exhausting contaminants through a protective cover, the outlet being located at the bottom of a side of the protective cover.

Preferably, four of such outlets are provided, one at each of four side surfaces of the protective cover. Each outlet defines a rectangular opening in the protective cover.

To achieve the third object, the present invention provides a method of washing contaminants induced into a polishing head of a CMP apparatus, wherein the contaminants are washed by spraying deionized water into a space in which the contaminants are present through purge holes formed in a retainer ring located at the lower peripheral portion of the polishing head.

Preferably, the deionized water is sprayed by nozzles installed within a load-cup where the loading and unloading of the wafers takes place. Also, the deionized water is preferably sprayed while rotating the polishing head.

BRIEF DESCRIPTION OF THE DRAWINGS

The above and other objects, features and advantages of the present invention will become more apparent from the following detailed description of a preferred embodiment thereof made with reference to the attached drawings, of which.

DETAILED DESCRIPTION OF THE PREFERRED EMBODIMENTS

Figure 1:
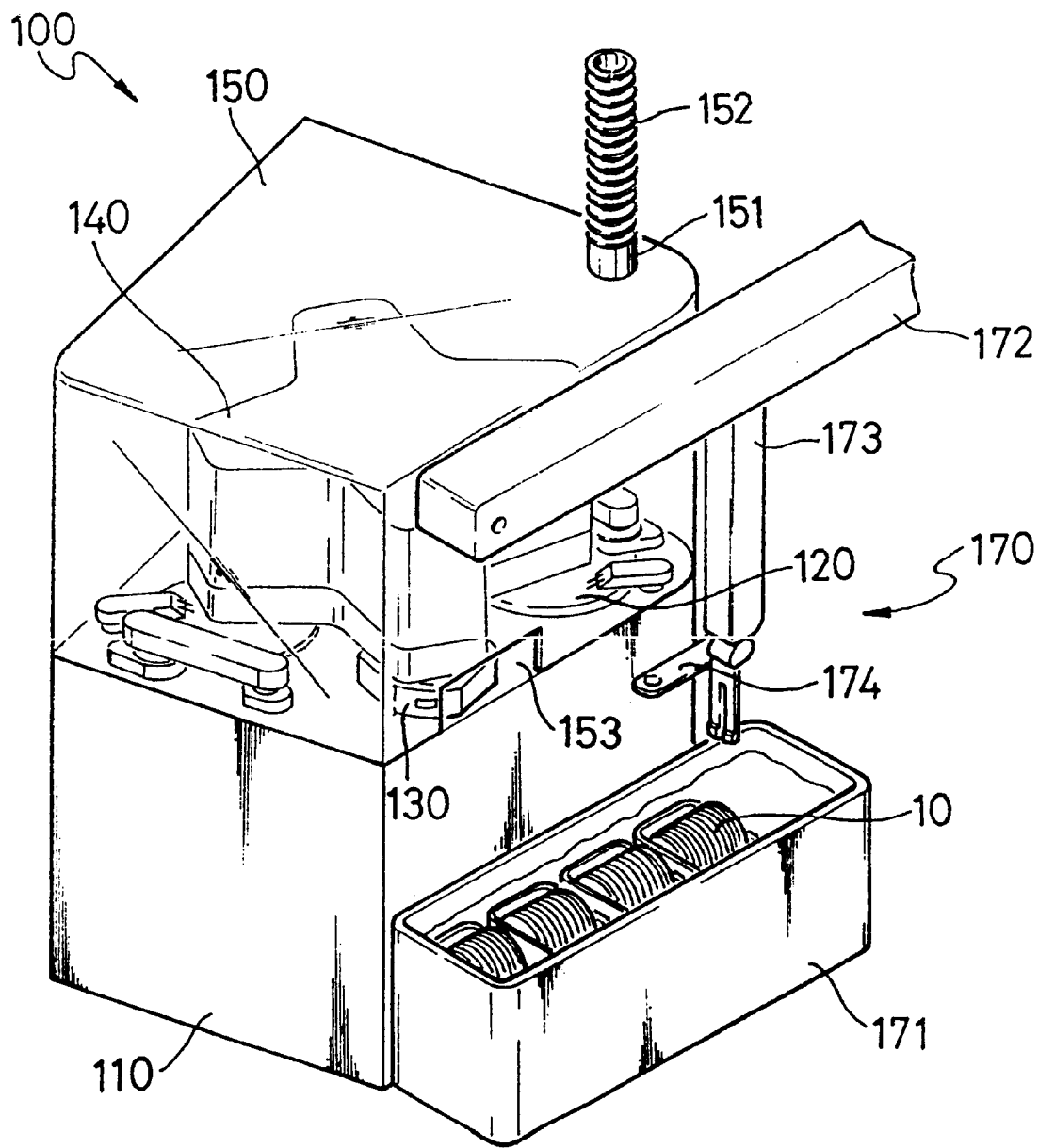
FIG. 1 is a perspective view of a conventional chemical mechanical polishing (CMP) system.
Figure 2:
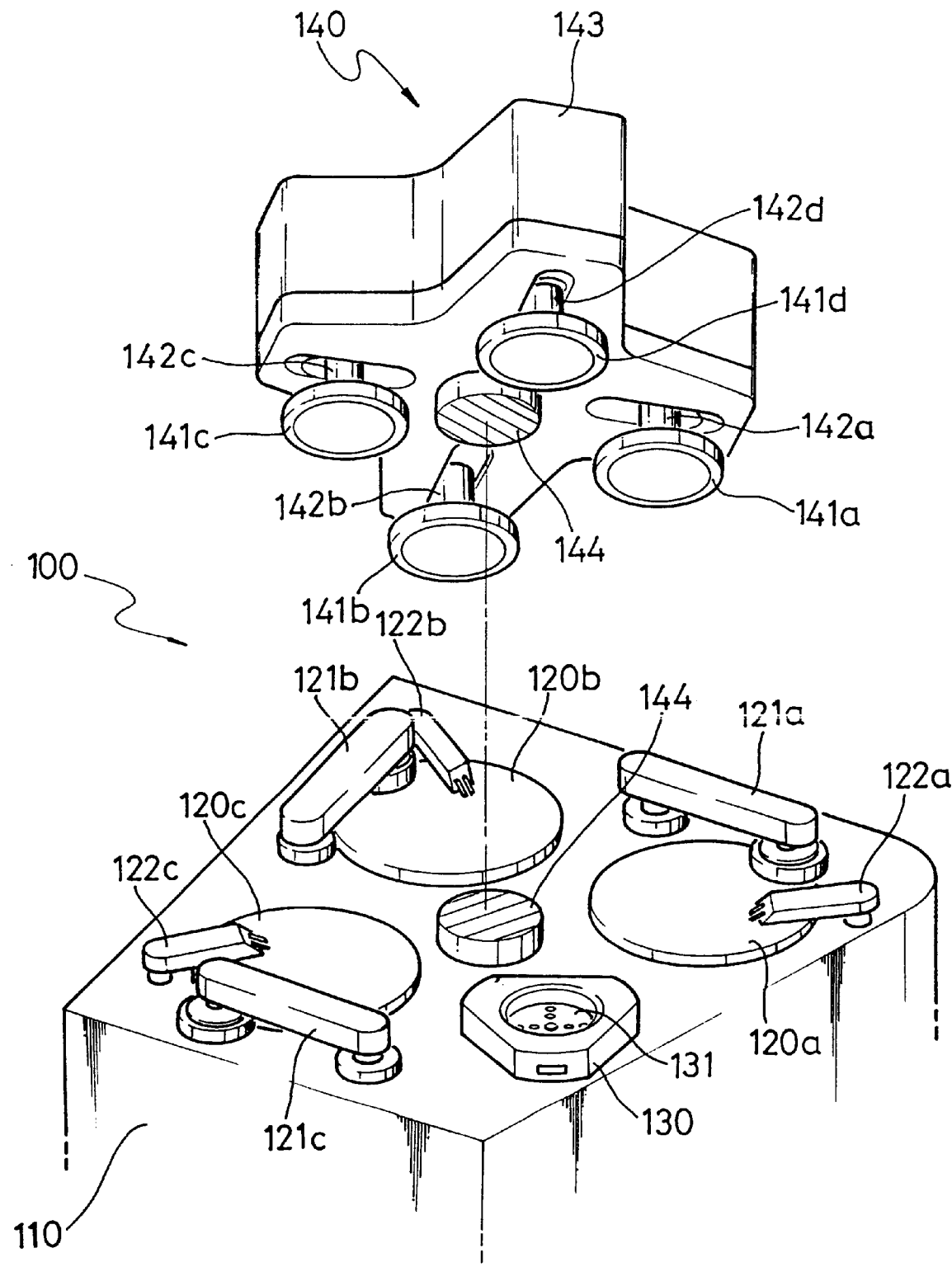
FIG. 2 is an exploded perspective view of the CMP apparatus of the system shown in FIG. 1.
Figure 3:
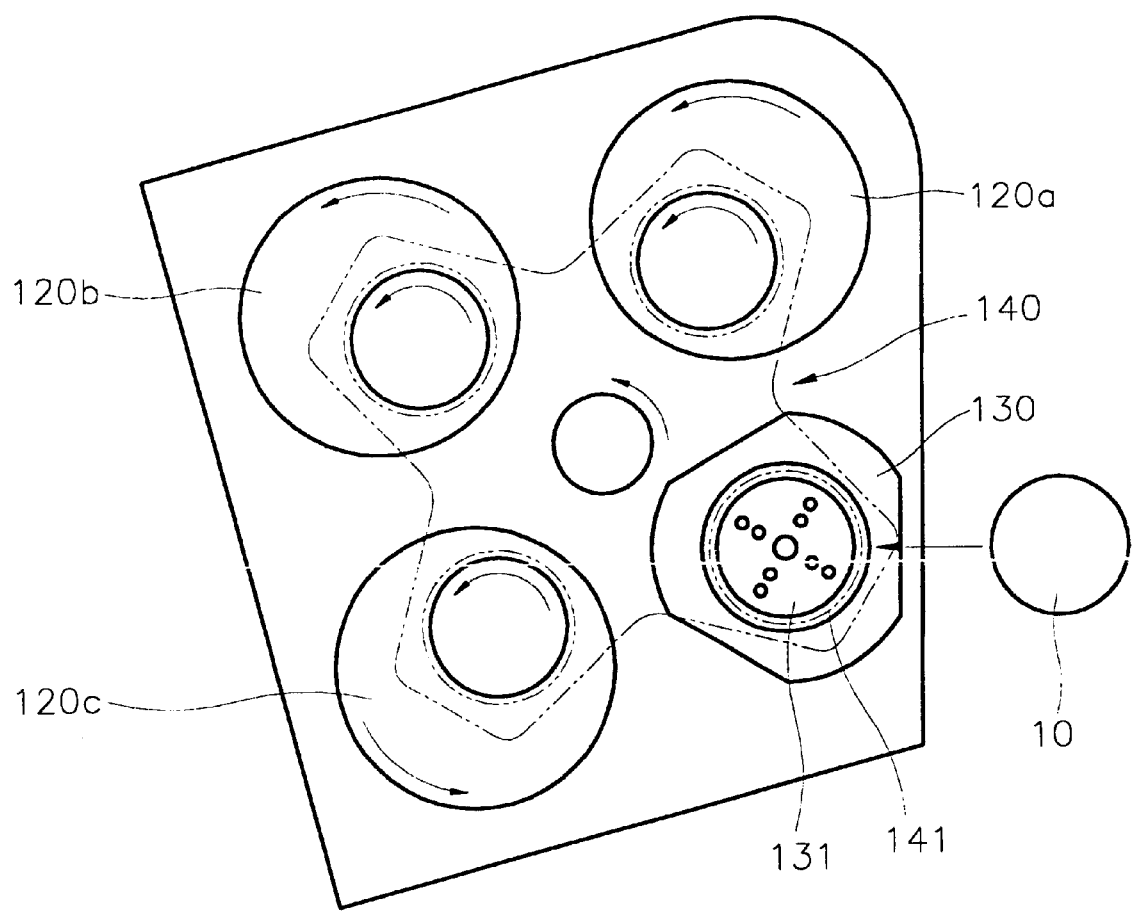
FIG. 3 is a top view of a lower portion of the CMP apparatus, illustrating the movement of a wafer during a polishing operation.
Figure 4:
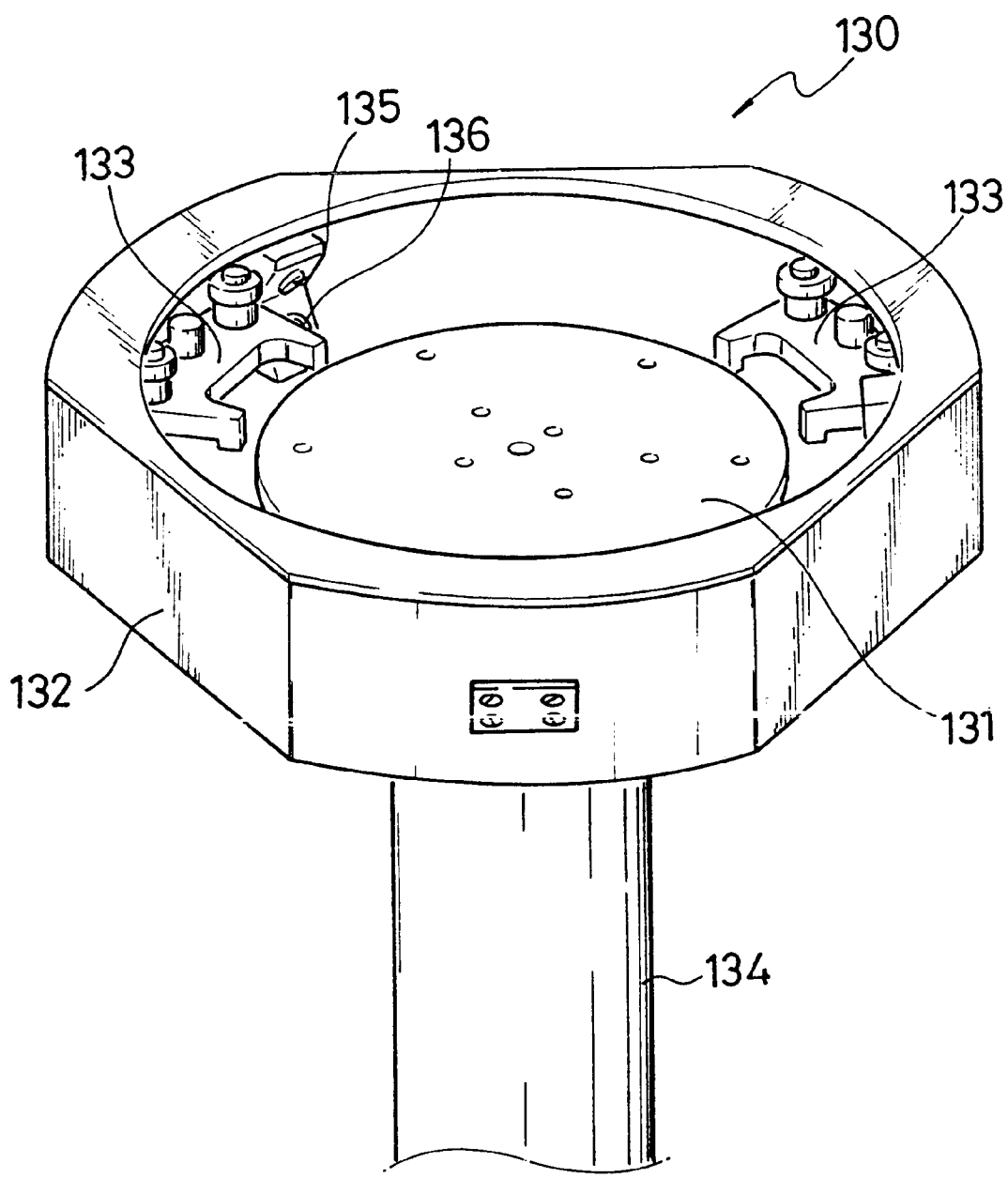
FIG. 4 is a perspective view of a load-cup of the conventional CMP apparatus.
Figure 5:
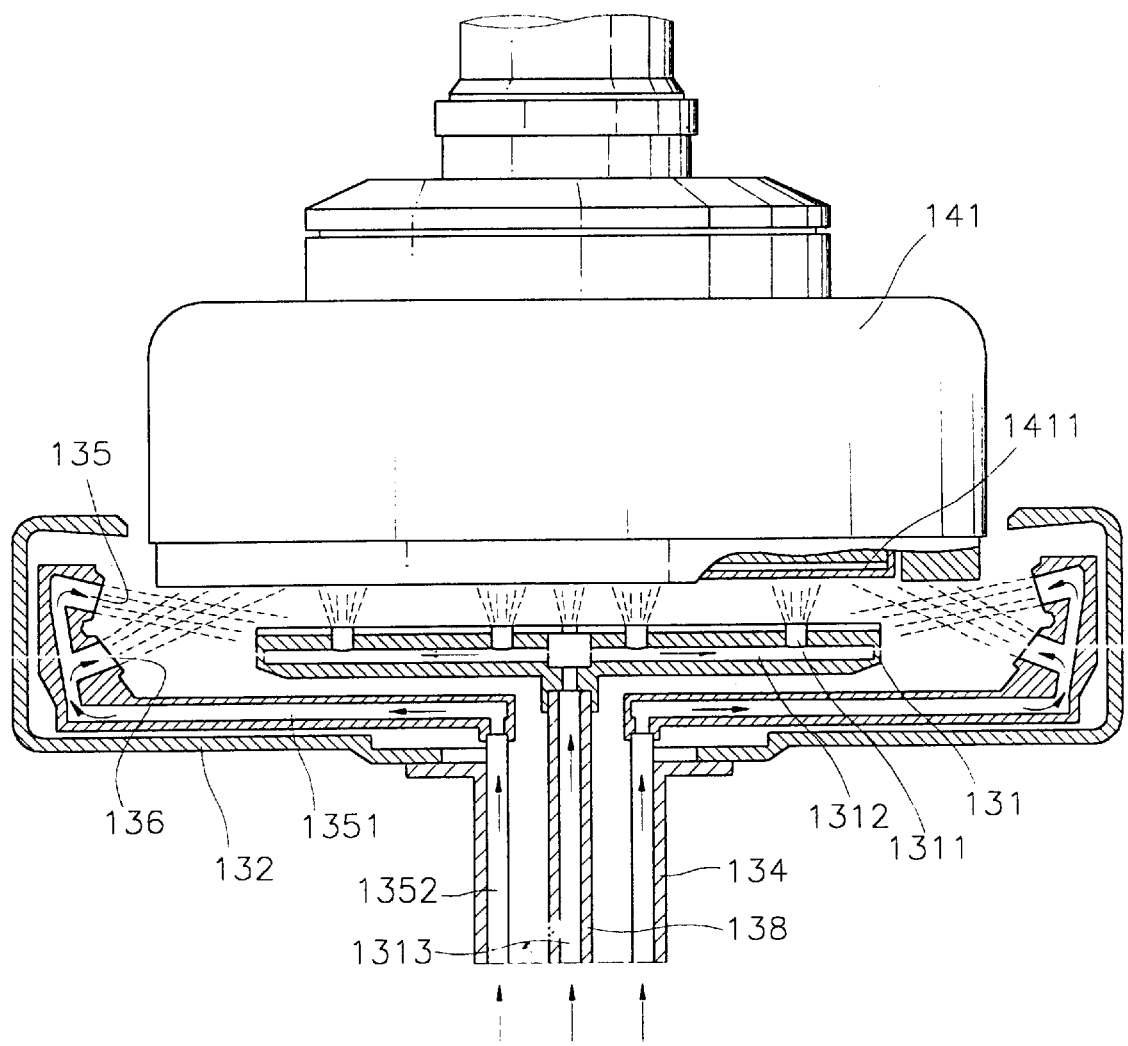
FIG. 5 is a partial vertical sectional view of the conventional CMP apparatus, as taken through the load-cup and polishing head thereof.
Figure 6:
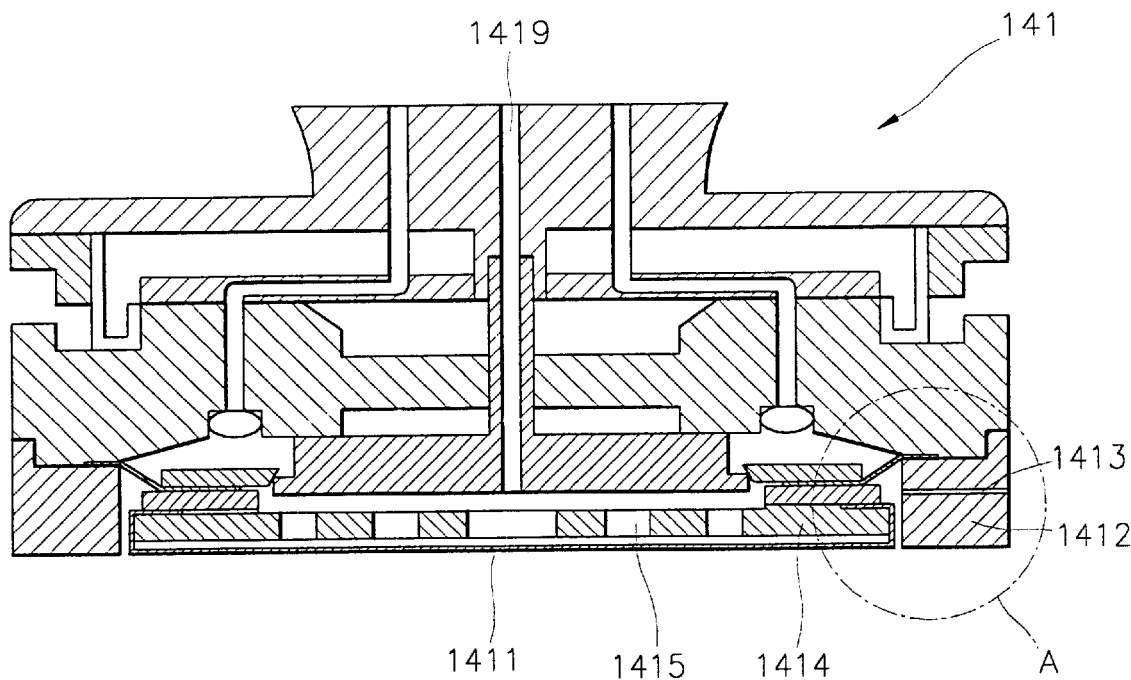
FIG. 6 is a cross-sectional view of a polishing head of the conventional CMP apparatus.
Figure 7:
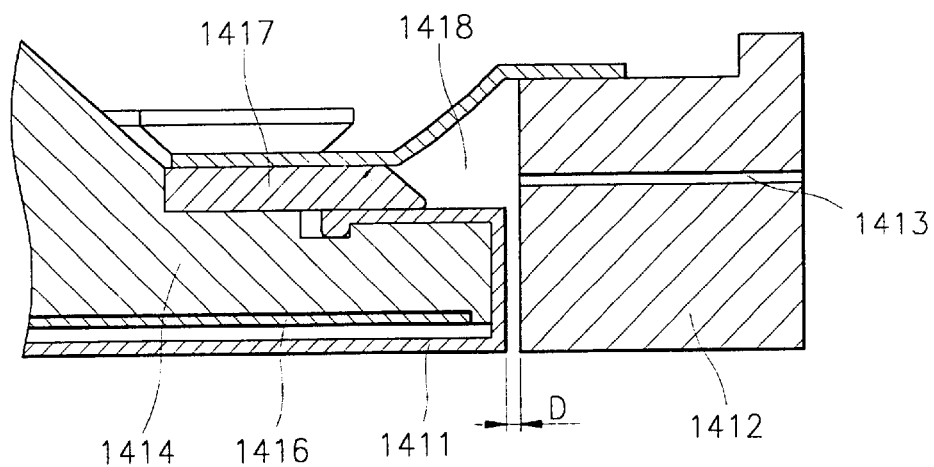
FIG. 7 is an enlarged view of a portion "A" of the polishing head encircled in FIG. 6.
Figure 8:
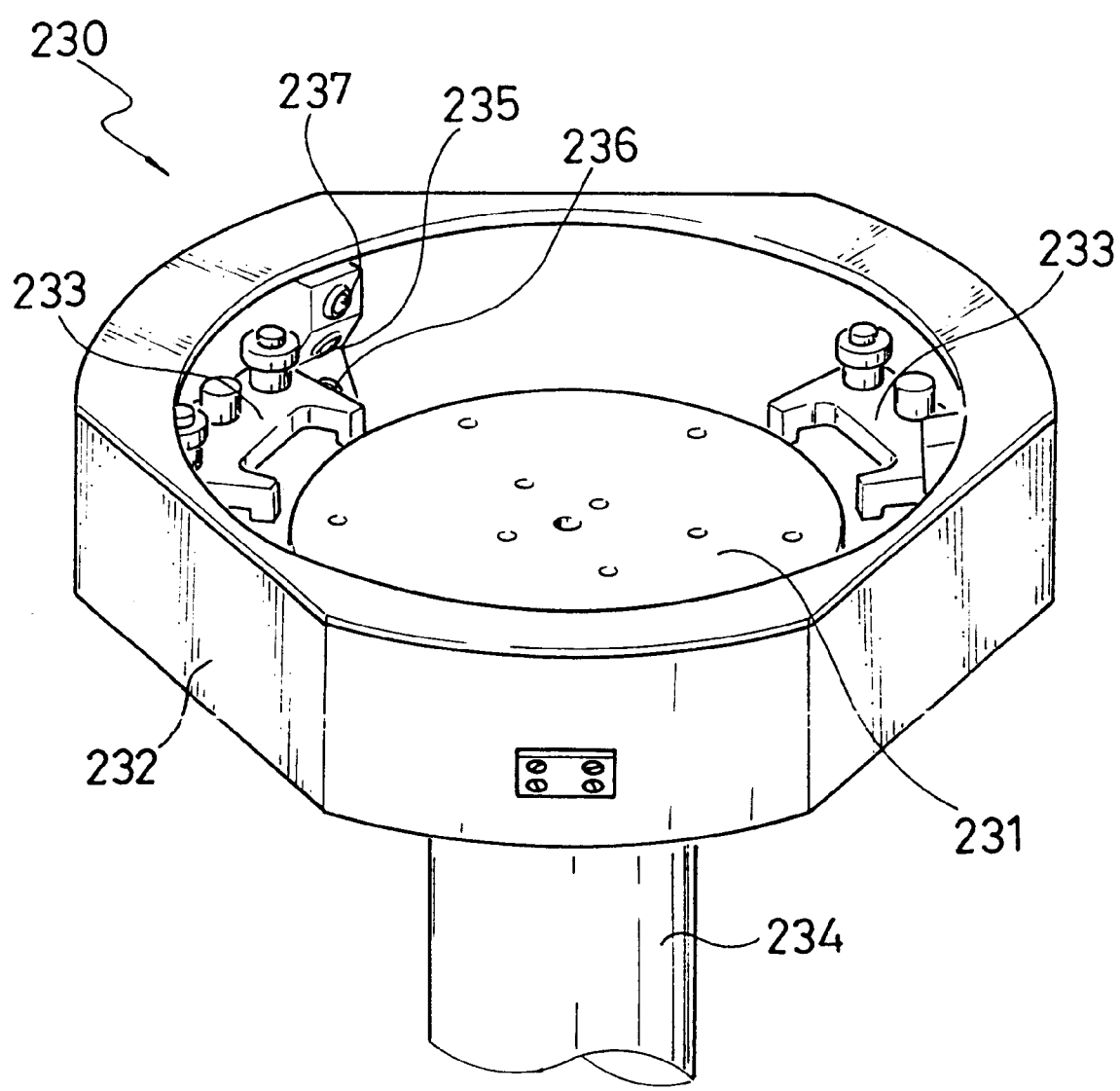
FIG. 8 is a perspective view of a load-cup of a preferred embodiment of a CMP apparatus according to the present invention.
Figure 9:
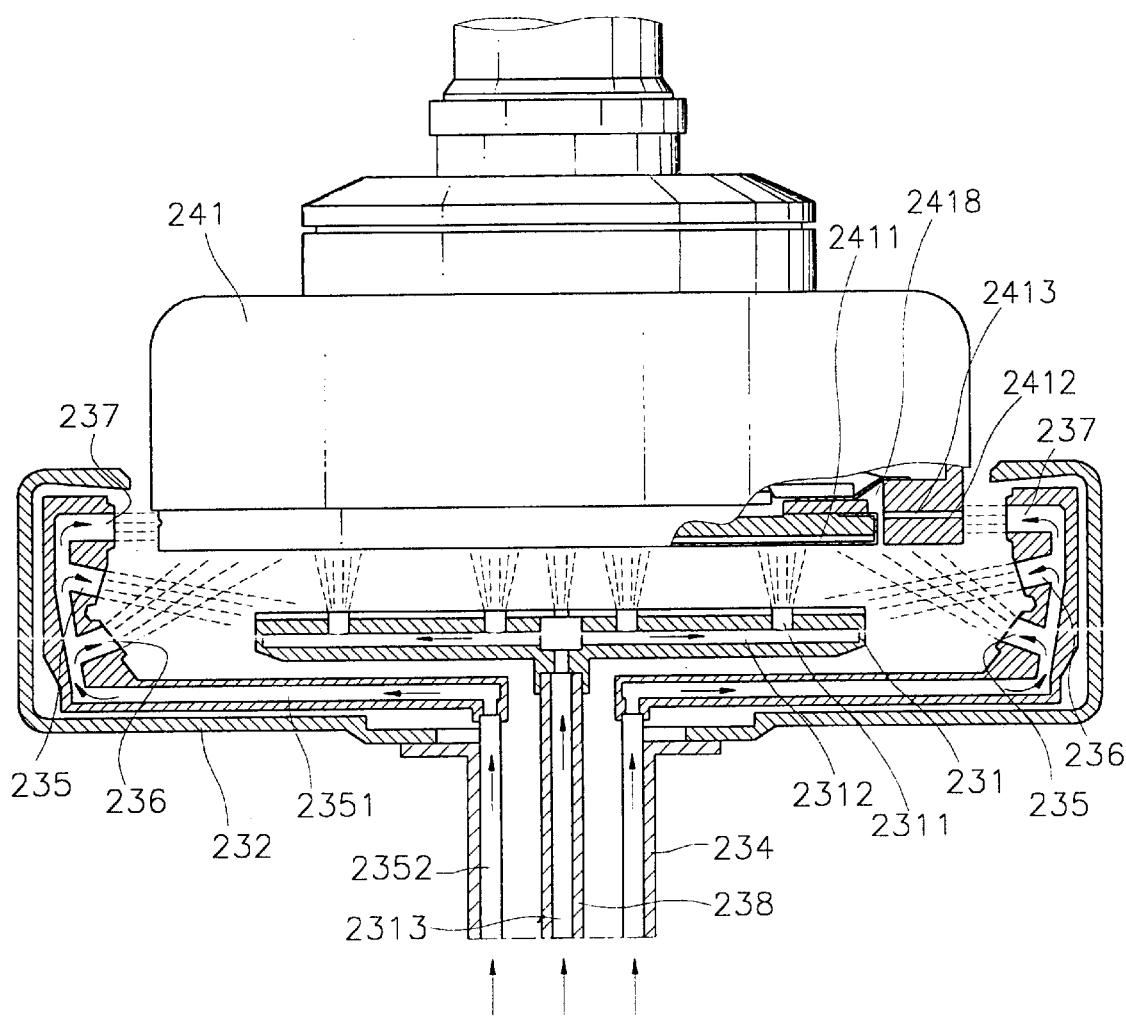
FIG. 9 is a partial vertical sectional view of the CMP apparatus of the present invention, as taken through the load-cup and polishing head thereof, illustrating a state in which a polishing head and a pedestal are washed.

Referring to FIGS. 8 and 9, a load-cup 230 of the CMP apparatus supports wafers once they are loaded in the apparatus, as they are being unloaded, and washes away contaminants such as slurry debris or polished silicon particles remaining on a polishing head 241 and a pedestal 231. With respect to the latter function, the load cup 230 includes a washing basin 232, and washing means comprising a first nozzle 235, a second nozzle 236 and a third nozzle 237 for spraying deionized water in the washing basin 232. The first nozzle 235 is oriented to spray deionized water toward the top surface of the pedestal 131 and the second nozzle 236 is oriented to spray deionized water toward a membrane 2411 on the bottom of the polishing head 241. The third nozzle 237 is oriented to spray deionized water through purge holes 2413 in a retainer ring 2412 toward a space 2418 formed between the outer surface of the membrane 2411 and the inner surface of the retainer ring 2412. The deionized water sprayed by the third nozzle 237 is used to wash the contaminants induced into the space 2418 away the polishing head 241, thereby preventing the contaminants from accumulating in the space 2418 and drying therein.

Three sets each of the first, second and third nozzles 235, 236 and 237 are disposed at equal angular intervals about the circumference of the pedestal 231. However, the number of nozzles may vary according to the present invention. In particular, the number of third nozzles 237 should conform to the number of purge holes 2413. That is to say, if there are four purge holes 2413 as in the conventional CMP apparatus, four third nozzles 237 are preferably provide each in association with a purge hole.

Reference numeral 233 in FIG. 8 denotes a wafer aligner, which serves to guide wafers into position on the pedestal 231.

The washing basin 232 is supported by a cylindrical support housing 234. A flexible hose 2352 for supplying deionized water to the first, second and third nozzles 235, 236 and 237 is installed within the support housing 234. The flexible hose 2352 is connected to one end of a washing fluid channel 2351 within the washing basin 231. The other end of the washing fluid channel 2351 is connected to the first, second and third nozzles 235, 236 and 237.

A plurality of spray orifices 2311 in the pedestal 231 spray deionized water upwards to wash the membrane 2411. A lateral passageway 2312 in the pedestal 231 connects the spray orifices 2311. The lateral passageway 2312 is, in turn, connected a vertical passageway 2313 formed inside a tubular pedestal column 238 which supports the pedestal 231.

Figure 10:
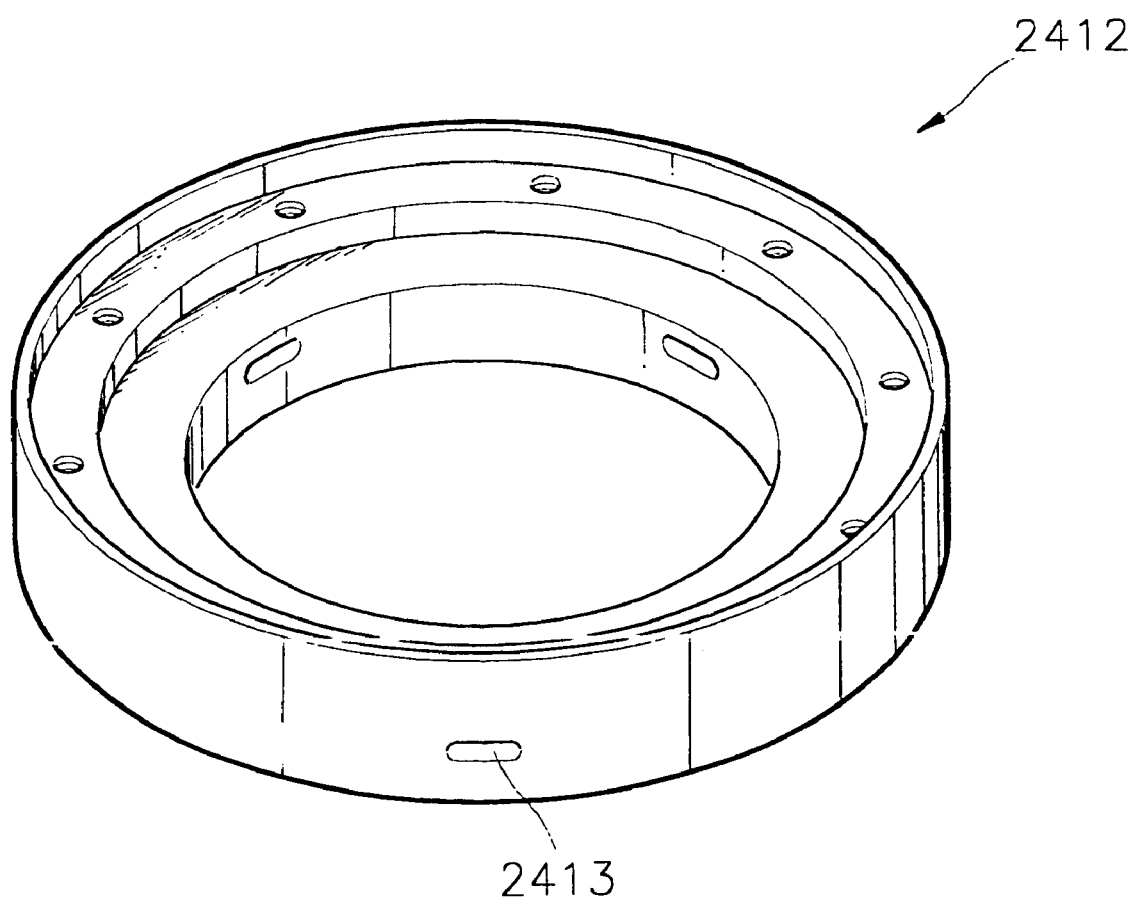
FIG. 10 is a perspective view of a retainer ring of the polishing head of the CMP apparatus according to the present invention.

FIG. 10 is a perspective view of the retainer ring 2412 of the polishing head 241. As shown in this figure, the purge holes 2413 in the retainer ring 2412 are in the form of elongate openings, i.e., slots. The slots allow the deionized water sprayed from the third nozzle 237 to easily penetrate into the space 2418 in which the contaminants are present, whereby the contaminants in the space 2418 can be more effectively washed away. Although the retainer ring 2412 shown in FIG. 10 includes three purge holes 2413, four or more purges holes 2413 may be provided.

Figure 11:
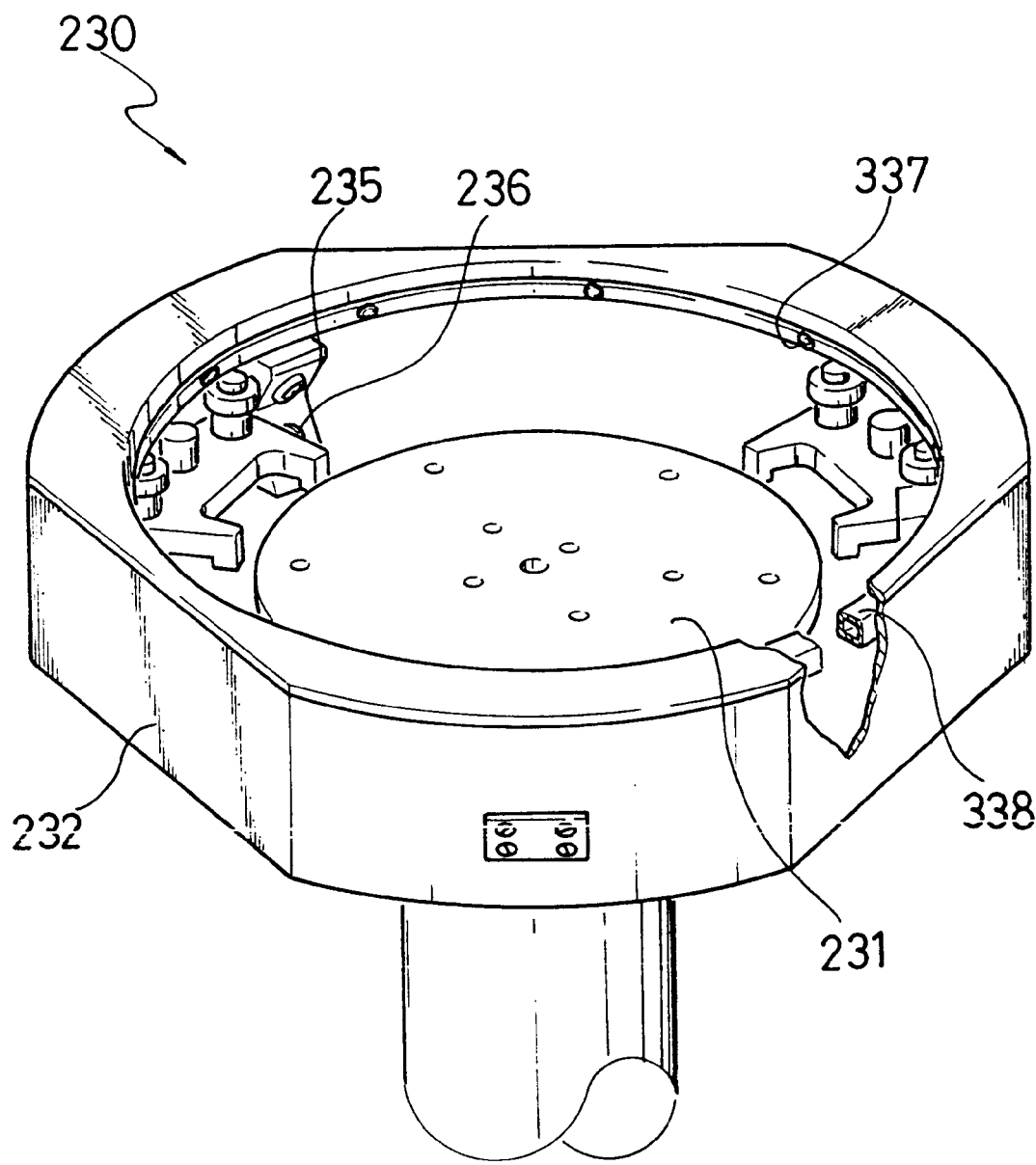
FIG. 11 is a perspective view of a load-cup of another embodiment of a CMP apparatus according to the present invention.

FIG. 11 shows another embodiment of a load-cup of a CMP apparatus according to the present invention. The washing means of this load-cup 230 includes an annular deionized water supply line 338 extending along the inner surface of the washing basin 232. The deionized water supply line 338 is connected to the washing fluid channel 2351 shown in FIG. 9. A plurality of third nozzles 337 are installed in the deionized water supply line 338 at predetermined intervals. Again, the number of third nozzles 337 is preferably the same as that of the purge holes 2413. As in the above-described embodiment, sets of the first and second nozzles 235 and 236 are spaced about the perimeter of the pedestal 231 at equal intervals.

This embodiment can be applied to the case where the polishing head 241 is rotated while it is being washed. Accordingly, the entire bottom surface of the polishing head 241 is effectively washed by the spray orifices 2311 and the second nozzles 236. In addition, even though the positions of the purge holes 2413 change, deionized water is effectively sprayed into the space 2418 in the polishing head 241 from the third nozzles 337 in the annular deionized water supply line 338.

Figure 12:
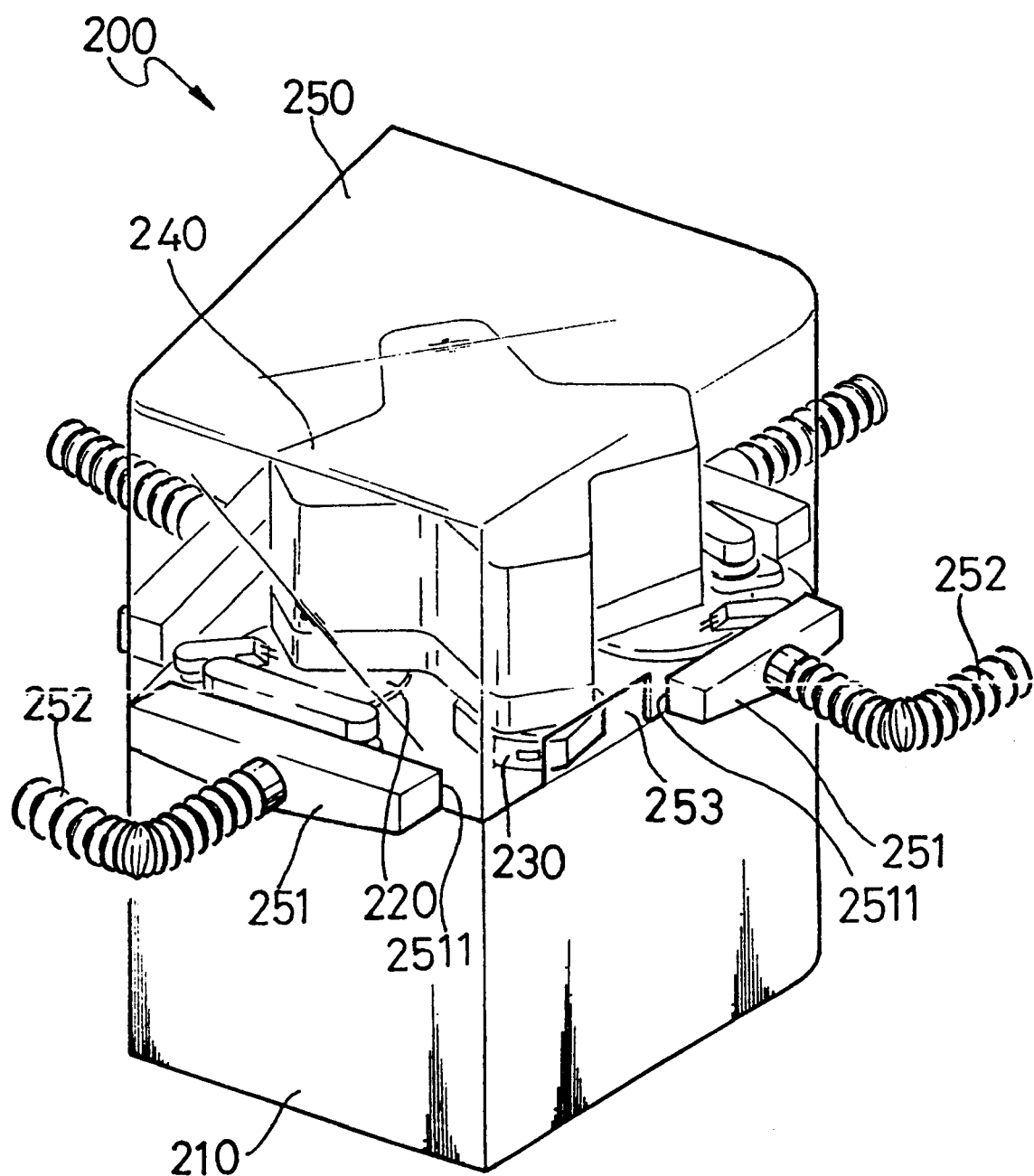
FIG. 12 is a perspective view of a CMP apparatus according to the present invention.

FIG. 12 illustrates a CMP apparatus according to the present invention provided with exhaust means for exhausting contaminants such as slurry debris or polished silicon particles from the apparatus. This CMP apparatus 200 includes a base 210, a plurality of polishing pads 220 installed on the base 210, a load-cup 230, and a head rotation unit 240 having a plurality of polishing heads which hold the wafers and rotate the same against the top surface of the polishing pads 220. A protective cover 250 surrounding the polishing pads 220, the load-cup 230 and the head rotation unit 240 is installed on the upper portion of the base 210. A wafer entrance 253 through which the wafers are loaded on/unloaded from the load-cup 230 by a wafer transfer apparatus is provided in one side of the protective cover 250.

The exhaust means includes an outlet 251, an exhaust pump (not shown) and an exhaust pipe 252 connecting the outlet 251 with the exhaust pump. Here, a feature of the present invention lies in that the outlet 251 extends through the side of the protective cover 250 at the bottom thereof. Therefore, the outlet 251 is disposed in the vicinity of the polishing pads 220 where the contaminants are mainly generated. Accordingly, the contaminants such as slurry debris or polished silicon particles which are larger and heavier than particles in the air can be effectively exhausted from the CMP apparatus.

Also, four outlets 251 are preferably provided, one through each of four sides of the protective cover 250. This facilitates the exhausting of the contaminants by shortening the path along which the contaminants must flow to be exhausted. Furthermore, the outlets 251 establish exhaust paths which extend radially outward from the central part of the apparatus, thereby preventing wafers or the polishing pads from contacting the contaminants while they are exhausted along such paths.

Also, the openings 2511 of the outlets 251 are preferably rectangular with their longer sides extending horizontally. Such rectangular openings 2511 can accommodate contaminants scattering over a wider area than openings having other shapes but the same unit cross-sectional area.

As described above, according to the present invention, contaminants such as slurry debris or silicon particles which are induced into the polishing head can be effectively washed away by the deionized water sprayed from the third nozzles 237 and can be effectively exhausted to the outside of the apparatus via the outlet(s) 251. Thus, scratches on the wafer surface due to the contaminants can be minimized, which in turn reduces the number of defects in the semiconductor devices and thereby improves the yield and reliability of the semiconductor devices.

Although the invention has been described with reference to specific embodiments thereof, various changes thereto will become apparent to those of ordinary skill in the art. Therefore, all such changes fall within the true spirit and scope of the invention as defined by the appended claims.

What is claimed is:

1. A chemical mechanical polishing (CMP) apparatus for planarizing a surface of a semiconductor wafer, the CMP apparatus comprising:
    a base;
    a polishing pad disposed on said base;
    a polishing head disposed above said base for holding a wafer and pressing the wafer against said polishing pad, said polishing head including a vacuum chuck comprising a membrane at the bottom thereof, and an annular retaining ring extending around said membrane and spaced therefrom so as to define a gap therebetween terminating at a space within said polishing head, said retainer ring having a plurality of purge holes extending radially therethrough and open to said space; and
    a load-cup supported on said base, said load-cup including a washing basin sized to accommodate said polishing head, a pedestal disposed at the bottom of the washing basin, first nozzles oriented so as to spray deionized water toward the top surface of said pedestal, second nozzles oriented so as to spray deionized water upwardly toward a central portion of a top opening of the washing basin, and third nozzles disposed at the side of the load-cup and oriented so as to spray deionized water in a radially inward direction with respect to the washing basin, whereby when said polishing head is lowered into said washing basin of the load-cup, deionized water sprayed from said second nozzles wash the bottom surface of the polishing head, and deionized water from said third nozzles is sprayed through said purge holes in the retainer ring for washing away contaminants induced into said space.

2. The CMP apparatus according to claim 1, wherein at least three of said third nozzles are disposed along an inner side surface of said washing basin and are spaced from one another therealong at equal intervals.

3. The CMP apparatus according to claim 1, wherein the number of third nozzles is the same as that of the purge holes.

4. The CMP apparatus according to claim 1, wherein said load-cup includes an annular deionized water supply line extending along an inner side surface of the load-cup, and said third nozzles are provided in the deionized water supply line as spaced apart from one another therealong.

5. The CMP apparatus according to claim 4, wherein the number of third nozzles is the same as that of the purge holes.

6. The CMP apparatus according to claim 1, and further comprising a protective cover extending over said base, and at least one exhaust outlet extending through said protective cover at the bottom of a side surface thereof.

7. The CMP apparatus according to claim 6, wherein said protective cover has four side surfaces extending upwardly from said base, and said at least one exhaust outlet comprises four exhaust outlets each extending through a respective one of said four sides of the protective cover.

8. The CMP apparatus according to claim 6, wherein each of said exhaust outlets defines a rectangular opening in the protective cover, the longer sides of the rectangular opening extending horizontally.

9. A method of washing a polishing head of a CMP apparatus, the polishing head including a vacuum chuck comprising a membrane disposed at the bottom of the polishing head, and an annular retaining ring extending around the membrane and spaced therefrom so as to define a vertically extending gap therebetween terminating at a space within the polishing head, the retainer ring having a plurality of purge holes extending radially therethrough and open to the space, said method comprising steps of:

positioning the polishing head in a washing basin; and while the polishing head is disposed in the washing basin, spraying deionized water radially into said space via said purge holes in the retainer ring, whereby contaminants in the space are dislodged by the deionized water and drain through the gap between the membrane and the retainer ring.

10. The method according to claim 9, wherein the washing basin is part of a load-cup which supports wafers once they are loaded into and as they are being unloaded from the CMP apparatus, and further comprising the step of lowering the polishing head into the washing basin of the load-cup.

11. The method according to claim 9, wherein the deionized water is sprayed while rotating the polishing head.

12. The CMP apparatus according to claim 3, wherein said purge holes are spaced from one another in the circumferential direction of the retainer ring at first angular intervals, and said third nozzles are spaced from one another in the circumferential direction of said load cup at second angular intervals corresponding to said first angular intervals, whereby when said polishing head is lowered into said washing basin of the load cup, said third nozzles can be aligned radially with said purge holes, respectively.

* * * * *